United States Patent [19]
Li et al.

[11] Patent Number: 6,075,293
[45] Date of Patent: Jun. 13, 2000

[54] SEMICONDUCTOR DEVICE HAVING A MULTI-LAYER METAL INTERCONNECT STRUCTURE

[75] Inventors: Xiao-Yu Li; Sunil D. Mehta, both of San Jose; Van H. Pham, Milpitas; Amit P. Marathe, Santa Clara, all of Calif.

[73] Assignee: Advanced Micro Devices, Inc., Sunnyvale, Calif.

[21] Appl. No.: 09/263,412

[22] Filed: Mar. 5, 1999

[51] Int. Cl.[7] ...................................................... H01L 23/48
[52] U.S. Cl. ........................... 257/763; 257/382; 257/383; 257/751; 257/752; 257/763; 438/636
[58] Field of Search ..................................... 257/751, 752, 257/763, 382, 383; 438/636

[56] References Cited

U.S. PATENT DOCUMENTS

| | | | |
|---|---|---|---|
| 5,382,817 | 1/1995 | Kashihara et al. | 257/295 |
| 5,523,624 | 6/1996 | Chen et al. | 257/751 |
| 5,600,170 | 2/1997 | Sugiyama et al. | 257/382 |
| 5,635,763 | 6/1997 | Inoue et al. | 257/763 |
| 5,668,410 | 9/1997 | Yamamoto | 257/737 |
| 5,883,433 | 3/1999 | Oda | 257/750 |
| 5,883,434 | 3/1999 | Noguchi | 257/750 |
| 5,910,021 | 6/1999 | Tabara | 438/636 |
| 5,914,277 | 6/1999 | Shinohara | 438/720 |

*Primary Examiner*—Mahshid Saadat
*Assistant Examiner*—Edgardo Ortiz
*Attorney, Agent, or Firm*—Brinks Hofer Gilson & Lione

[57] ABSTRACT

A multi-level metal interconnect structure in a semiconductor device includes a plurality of overlying metal layers separated by ILD layers and electrically connected by filled vias in the ILD layers. Each metal layer includes a relatively thick antireflective layer for improved electromigration resistance. Each metal layer also includes a metal lining layer and a metal interconnect layer overlying the metal lining layer. Enhanced electromigration resistance is obtained by forming the antireflective layer to a thickness of no less than the thickness of the metal lining layer. In a preferred embodiment of the invention, the antireflective layer has a thickness of about 1000 angstroms.

20 Claims, 2 Drawing Sheets

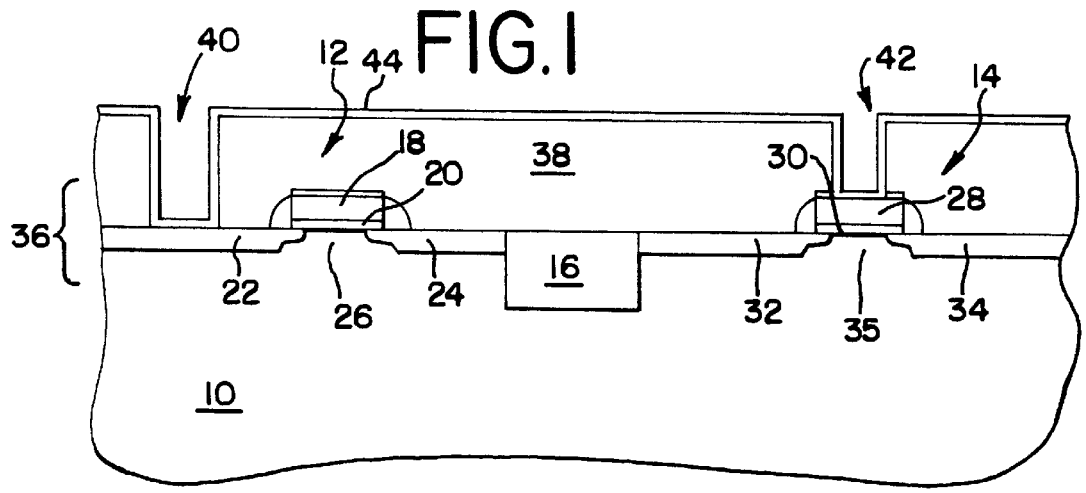
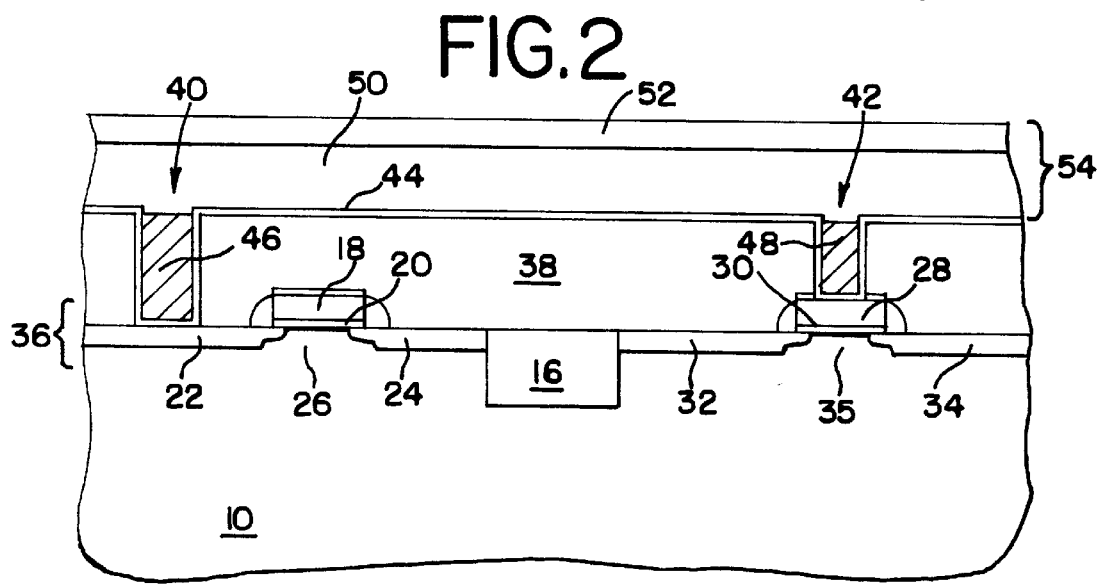
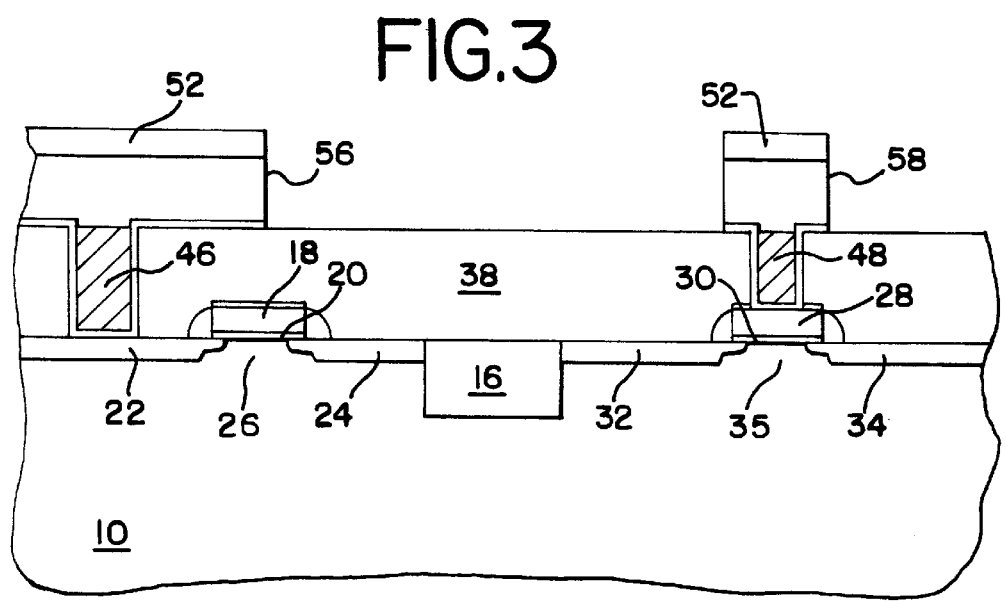

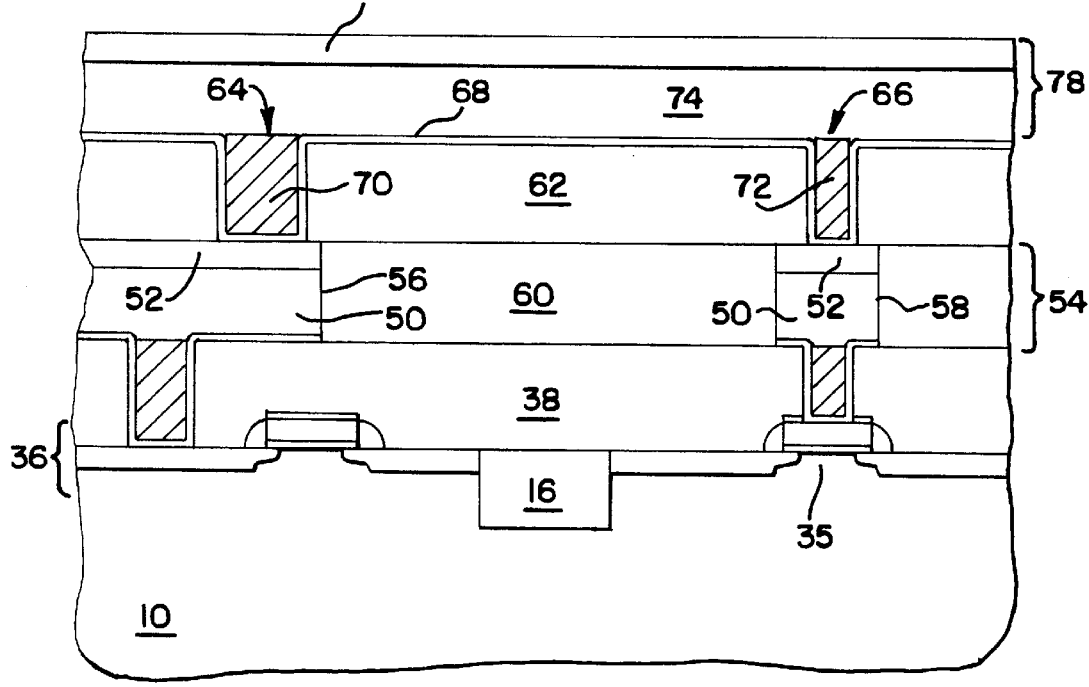
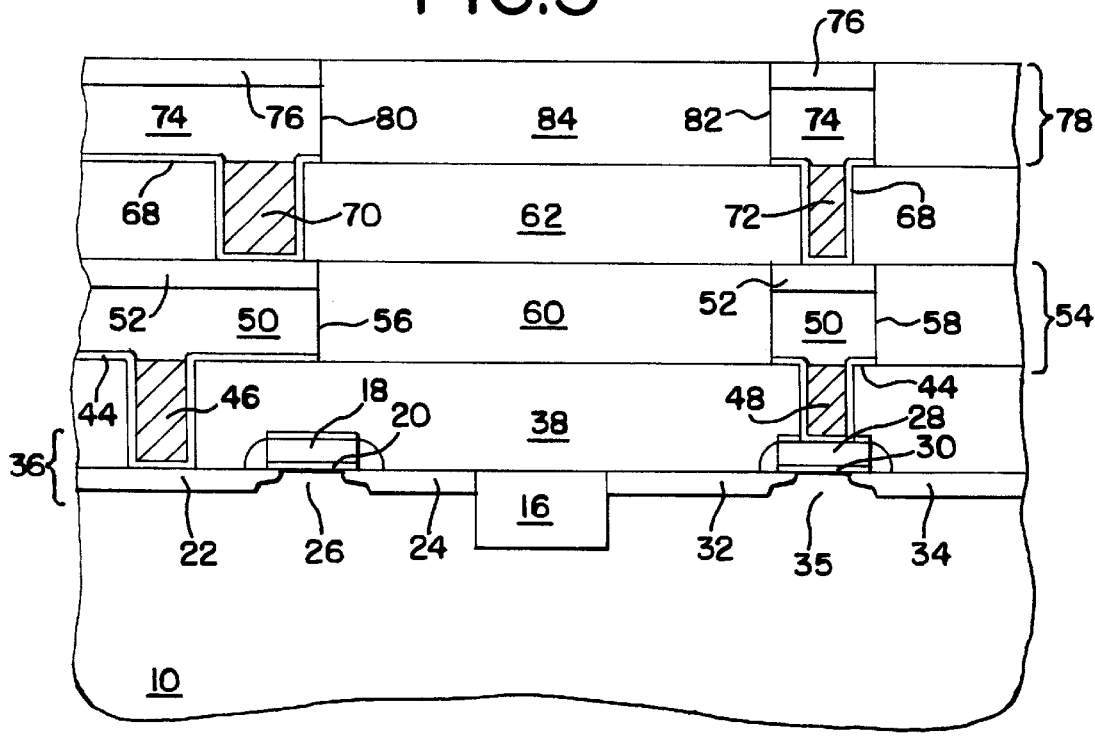

SEMICONDUCTOR DEVICE HAVING A MULTI-LAYER METAL INTERCONNECT STRUCTURE

FIELD OF THE INVENTION

This invention relates, in general, to semiconductor devices and to methods for their fabrication, and more particularly, to semiconductor devices having high density, multi-level metal interconnects.

BACKGROUND OF THE INVENTION

In order to build faster and more complex integrated circuits, semiconductor device manufacturers have increased the number of components in the integrated circuits, while reducing the overall size of the circuit. The small circuit size requires multiple overlying metal interconnect layers to electrically connect the vast number of components within the integrated circuit. The multi-level metal interconnects are necessary in order to provide the large quantity of electrical connections necessary to electrically couple the density packed device components to each other, and to electrical circuitry within the device packaging.

With the advent of ultra-large-scale-integration (ULSI) semiconductor technology, multi-level interconnect layers must be fabricated at increasingly high-density levels. Each metal interconnect layer includes a large number of metal leads arrayed over and inter-level-dielectric (ILD) layer. The individual metal leads are fabricated using high resolution photolithographic and etching methods to have a very small line width. A high packing density of metal leads is obtained by placing the leads very close together, such that a very small line-space pitch is achieved.

In order to electrically couple the individual metal leads of a multi-level interconnect structure, vias openings are formed in the ILD layers and metal plugs are formed within the vias. The metal plugs provide an electrical conduit between overlying metal interconnect layers. Most often, the metal interconnect layers are composed of aluminum and aluminum alloys. Although aluminum and aluminum alloys can be used to form metallized vias plugs, in certain cases aluminum cannot be reliability deposited to form a high-reliability via plug. Accordingly, tungsten has become a widely used material for the formation of metallized via plugs. Tungsten possesses high electrical conductivity, and can be readily deposited into high aspect ratio vias. The aspect ratio of a via opening is determined by the ratio of the depth of the opening to the diameter of the opening. Typically, in a ULSI device, the aspect ratio of via openings can be 4:1 or higher.

Although tungsten can readily be used to form via plugs, the physical properties of tungsten differ substantially from the physical properties of aluminum and aluminum alloys. For example, tungsten is a mechanically hard, high-density metal having a high melting point. In contract, aluminum is a soft ductile metal having a relatively low melting point, and characterized by large grain structure. When electrons flow from hard metals, such as tungsten, to a softer metal, such as aluminum, the electron flow pushes atoms in the softer metal away from the interface. This phenomenon is known as electromigration and severely degrades the current handling capability of the metal interconnect structure. Because tungsten has a high density and melting point, it does not experience a mechanical deformation when subjected to a high electrical current. Moreover, tungsten does not self-diffuse when subjected to high electrical current. Therefore, electromigration of the softer metal in the direction of electron flow causes a void at the tungsten-aluminum interface.

To combat electromigration in aluminum interconnect structures, aluminum is alloyed with copper and other metals to increase its hardness and provide enhanced resistance to electromigration. Additionally, refractory metal barrier layers have been fabricated to reside between the tungsten plug and the metal interconnect layer. Use of refractory metal barrier layers is reasonably effective in reducing electromigration within the interconnect structure. However, even with the use of refractory metal barrier layers, severe degradation and device performance over long periods of time is still observed. For example, devices fabricated with aluminum alloy metallization and refractory metal barrier layers can suffer electromigration defects that reduce the useful lifetime below a commercially viable level. Accordingly, improvements are necessary in high-density, multi-level metal interconnect technology to enable the fabrication of devices with improved quality and enhanced lifetime performance.

SUMMARY OF THE INVENTION

The present invention is for a semiconductor device having a multi-layer metal interconnect structure. The multi-layer metal interconnect structure is particularly well suited to semiconductor technology that utilizes filled vias to electrically couple two or more overlying metal interconnect layers. The metal interconnect structure of the invention provides enhanced resistance to electromigration by selectively controlling the thicknesses of the various metal layers comprising the multi-layer metal interconnect. For example, by providing a relatively thick antireflective layer overlying the metal interconnect layer, the usable lifetime of the metal interconnect can be dramatically extended. The increase in lifetime achieved through a reduction in electromigration is also realized when the multi-layer metal interconnect is electrically coupled to a refractory-metal filled via.

In one form, a semiconductor device fabricated in accordance with the invention includes a semiconductor substrate having a device layer thereon. A multi-level metal layer overlies the device layer. The multi-level metal layer includes a metal lining layer and a metal interconnect layer overlying the metal lining layer. An antireflective layer overlies the metal interconnect layer. The thickness of the antireflective layer is no less than the thickness of the metal lining layer. In a preferred embodiment of the invention, the antireflective layer has a thickness of no less than about 1,000 angstroms.

BRIEF DESCRIPTION OF THE DRAWING

FIGS. 1–5 illustrate, in cross-section, process steps in accordance with the invention for the fabrication of two multi-layer metal interconnects coupled together by refractory-metal filled vias.

It will be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

Shown in FIG. 1, in cross-section, is a portion of a semiconductor substrate 10 having already undergone several processing steps. Semiconductor substrate 10 includes a first metal-oxide-semiconductor (MOS) transistor 12 and a second MOS transistor 14. An isolation region 16 electrically isolates first MOS transistor 12 from second MOS transistor 14. First MOS transistor 12 includes an insulated gate electrode 18 overlying a gate oxide layer 20, and source and drain regions 22 and 24. A channel region 26 separates source and drain regions 22 and 24. Similarly, second MOS transistor 14 includes an insulated gate electrode 28 overlying a gate oxide layer 30 and source and drain regions 32 and 34. A channel region 35 separates source region 32 from drain region 34.

Collectively, first and second MOS transistors 12 and 14 comprise a device layer 36. Those skilled in the art will appreciate that device layer 36 can include a wide variety of electrical components commonly found in a semiconductor device. In addition to the MOS transistors illustrated in FIG. 1, device layer 36 can also include floating-gate transistors, thin-film resistors, capacitors, and the like. Accordingly, all such structures are included within the scope of the term "device layer" as used herein.

An insulation layer 38 overlies device layer 36 and has a first contact opening 40 and a second contact opening 42 therein. First contact opening 40 exposes a portion of drain region 22, and second contact opening 42 exposes a portion of date electrode 28.

A metal lining layer 44 overlies insulation layer 38 and extends into first and second contact openings 40 and 42. Metal lining layer 44 is preferably a composite metal layer including a refractory metal layer and a refractory metal nitride layer. In a preferred embodiment of the invention, metal lining layer 44 includes a titanium nitride layer overlying a titanium layer. In one embodiment of the invention, the titanium layer is deposited to have thickness of preferably about 100 to 200 angstroms, and more preferably, about 150 angstroms. The titanium nitride layer is deposited to have a thickness of preferably about 400 to 800 angstroms, and more preferably, about 600 angstroms. The titanium and titanium nitride layers can be formed by various metal deposition techniques. For example, reactive ion sputtering and physical vapor deposition (PVD) methods can be used. Additionally, chemical-vapor-deposition (CVD) and plasma-enhanced-CVD (PECVD) methods can also be used.

After depositing metal lining layer 44, first and second contact openings 40 and 42 are filled with metal plugs 46 and 48, respectively. As illustrated in FIG. 2, metal plug 46 substantially fills first contact opening 40, and metal plug 48 substantially fills second contact opening 42. In a preferred embodiment, metal plugs 48 and 50 are a refractory metal, such as tungsten, and the like. Alternatively, metal plugs 46 and 48 can be a refractory metal alloy, copper, a copper alloy, and the like.

Metal plugs 46 and 48 are preferably formed by means of a planarization process, in which a metal layer is deposited to overlie metal lining layer 40 filling first and second contact openings 40 and 42. Then, a planarization process is carried out to remove portions of the metal layer overlying the upper surface of metal lining layer 44. Upon completion of the planarization process, a substantially planar surface is formed to cross the upper portion of insulation layer 38. The planarization process can be carried out by either a chemical-mechanical-polishing (CMP) process, or alternatively, by an etch-back process. Where a CMP process is used, metal lining layer 44 acts as a polished stop layer. In the alternative planarization process, metal lining layer 44 acts as an etch stop layer. In either process, metal lining layer 44 is utilized in the planarization process to form filled vias in the multi-level metal structure of the invention. Those skilled in the art will appreciate that metal lining layer 44 can perform additional functions, such as providing a barrier to the diffusion of contaminants, and to promote the adhesion of metal plugs 46 and 48 to underlying layers.

Once metal plugs 46 and 48 are formed, a metal interconnect layer 50 is deposited to overlie metal lining layer 44 and metal plugs 46 and 48. Preferably, metal interconnect layer 50 is an aluminum alloy deposited by either PVD or CVD techniques. In a preferred embodiment of the invention, metal interconnect layer 50 is aluminum alloyed with preferably about 0.5 to 1.5 wt. % copper and more preferably about 1 wt. % with copper and deposited to a thickness of preferably about 7000 to 9000 angstroms, and more preferably, about 8,000 angstroms.

Immediately following the formation of metal interconnect layer 50, an antireflective layer 52 is deposited to overlie metal interconnect layer 50. Preferably, antireflective layer 52 is a refractory metal nitride layer deposited to a thickness of no less than the thickness of metal lining layer 44. In a preferred embodiment of the invention, antireflective layer 52 is titanium nitride deposited to a thickness of no less than about 1,000 angstroms. Preferably, antireflective layer 52 is deposited by a PVD process or CVD process. Collectively, metal lining layer 44, metal interconnect layer 40 and antireflective layer 52 comprise a first metal layer 54.

The fabrication process of the inventive multi-layer metal structure continues by patterning first metal layer 54, as illustrated in FIG. 3. The patterning process forms metal leads 56 and 58 overlying insulation layer 38. Preferably, metal leads 56 and 58 are formed by a lithographic patterning and ion etching process to form a desired pattern on the surface of insulation layer 38. In order to form densely-packed leads, advanced processing technology is used to form leads having a line width of about 0.3 to 0.6 microns and a pitch of about 0.6 to 1.2 microns. For example, once a lithographic pattern has been formed on first metal layer 54, reactive ion etching processes are used to sequentially etch antireflective layer 52, metal interconnect layer 50, and metal lining layer 44. The reactive ion etching process can be carried out in, for example, a cluster-tool in which the various metal layers are etched in separate ion etching chambers contained within the cluster-tool.

As illustrated in FIG. 4, once metal leads 56 and 58 are formed, a first ILD layer 60 is formed to overlie insulation layer 38. First ILD layer 60 is preferably a composite layer of silicate glass and spin-on-glass (SOG). Preferably, first ILD layer 60 is formed by a deposition and planarization process to form a smooth surface in the upper portion of ILD 60 that is continuous with the upper surface of leads 56 and 58. As in metal planarization process described above, first ILD layer 60 can be planarized by a CMP process, or alternatively, by a deposition and etch-back process.

After first ILD layer 60 is formed, a second ILD layer 62 is formed to overlie first ILD layer 60. First and second vias 64 and 66 are formed in second ILD layer 62 to expose surface portions of leads 56 and 58, respectively. Importantly, the relatively large thickness of antireflective layer 52 provides an etch-stop during the formation of first and second vias 64 and 66. Preferably, a selective etching process is used to etch the via openings in first ILD layer 60. The selective etching process removes dielectric material at a much higher rate than the metal composition of antireflective layer 52. In one method, fluorinated etching chemistry is used in a reactive ion etching process to form via openings 64 and 66. The relatively large thickness of antireflective layer 52 cooperates with the selective etching process to insure that the metal interfaces within vias 64 and 66 will be uniform. Those skilled in the art will appreciate that etching damage to exposed metal surfaces can result in increased electromigration in metallized vias. By both increasing the relative thickness of the antireflective layer and employing a selective etching process, a uniform metal interface can be fabricated at the bottom of each via.

After second ILD layer 62 and first and second vias 64 and 66 are formed, the metallization process described above is again carried out to form another metal layer. First, a metal lining layer 68 is deposited to overlie second ILD 62 and extends into first and second vias 64 and 66. Then, metal plugs 70 and 72 are formed in first and second vias 64 and 66, respectively, Next, a metal interconnect layer 74 is deposited to overlie metal lining layer 68 and metal plugs 70 and 72. In similarity with first metal layer 54, metal interconnect layer 74 is preferably an aluminum/copper alloy layer deposited to a thickness of preferably of about 6000 to 9000 angstroms, and more preferably, about 8,000 angstroms.

In accordance with the invention, an antireflective layer 76 is deposited to overlie metal interconnect layer 74. Preferably, antireflective layer 76 is titanium nitride deposited to a thickness of no less than the thickness of metal lining layer 68. In a preferred embodiment, antireflective layer 76 is deposited to a thickness of no less than about 1,000 angstroms. Collectively, metal lining layer 68, metal interconnect layer 74, and antireflective layer 76 comprise a second metal layer 78. Second metal layer 78 is electrically coupled to leads 56 and 58 of first metal layer 54 by via plugs 70 and 72. Again, because of the relatively large thickness of antireflective layer 76, the etching process used to form vias 64 and 66 does not remove substantial portions of antireflective layer 52 of metal leads 56 and 58. Accordingly, the fabrication process preserves the structural integrity of first metal layer 54 during the formation of electrical interconnects between first metal layer 54 and second metal layer 78.

Following the formation of second metal layer 78, a lithographic patterning and ion etching process is carried out to form metal leads 80 and 82 overlying second ILD layer 62, as illustrated in FIG. 5. In similarity with the process described above, a third ILD layer 84 is formed to overlie second ILD layer 62. Metal plugs 70 and 72 electrically couple leads 80 and 81 of second metal layer 78 to leads 56 and 58 of first metal layer 54. In particular, metal plugs 70 and 72 electrically connect leads 80 and 82 to antireflective layer 52 of metal leads 56 and 58.

First metal layer 54 and second metal layer 78 form the first and second metal layers of a multi-layer metal structure. Although only two metal layers are illustrated in FIG. 5, the multi-level metal structure of the invention can include more than two overlying metal layers. Additional metal layers and filled vias can be fabricated in accordance with the previously described fabrication process. Further, each ILD layer can include numerous via openings that electrically couple various metal leads formed from each metal layer.

A semiconductor device fabricated in accordance with the invention and including the multi-layer metal interconnect structure exhibits enhanced electromigration resistance and improved functional life time. Although not wishing to have their invention restricted to any particular theory, the inventors believe that the enhanced electromigration resistance results from additional electrical shunting brought about by incorporation of a relatively thick antireflective layer.

Additionally, it is believed that the relatively thick antireflective layers function to relieve stress in the metal layers underlying the antireflective layer. By reducing the stress in the metal layers, electromigration pathways are minimized. Accordingly, the annealing effect of joule heating from electrical shunting, and the stress relief combine to yield a semiconductor device exhibiting improved lifetime.

Without further elaboration, it is believed that one skilled in the art can, using the preceding description, utilize the invention to its fullest extent. The following example is, therefore, to be construed as merely illustrative of the invention, and not to limit the reminder of the disclosure in any way whatsoever.

EXAMPLE

Package level electromigration tests were carried out using test structures that incorporated via chains and two layers of metal. Each of two test structures included a titanium nitride antireflective layer overlying an aluminum/copper interconnect layer. The samples were processed to have a metal lining layer of titanium having a thickness of about 250 angstroms. An aluminum metal interconnect layer having about 1 wt. % copper was then deposited to a thickness of about 8,000 angstroms over the metal lining layer. The samples were split and a first group of samples processed to have a titanium nitride antireflective layer of thickness of about 500 angstroms, and a second group of samples were processed to have a titanium nitride antireflective layer thickness of about 1000 angstroms. The composite metal layer was patterned to form metal leads having a width of about 0.5 microns and a length of about 800 microns. One group of test structures included two overlying metal leads separated by an ILD layer and electrically connected by a series of 1.0 micron metallized vias.

Testing was carried out for both metal 2 leads (M2) and for the via chains (VIA2). Lifetime testing was performed as follows. A constant current of about 8 mA was forced through the test structures at a constant applied voltage, while monitoring the electrical resistance. Because of joule heating the temperature of the test structure was elevated to about 200° C. Testing was carried out with three groups of test structures, each group having 20 test structures. During testing, a test structure was determined to fail if the resistance value increased by 20% compared to the initial resistance value.

The results of lifetime testing are shown in the Table below. The average lifetime, reported in years, is extrapolated from the test conditions to the expected lifetime of the devices under normal operating conditions.

TABLE

Electromigration Test - Lifetime (Years)
Stress Conditions: 8 mA at 200° C.; Ea = 1.04; n = 1.26

| | Antireflective Layer Thickness | |
|---|---|---|
| | 500 Å | 1000 Å |
| Metal2 | 4.4 | 20.4 |
| VIA2 (1.0 micron) | 1.5 | 10.5 |

The electromigration test results show a substantial improvement in device lifetime when the antireflective layer thickness is increased from 500 to 1000 angstroms.

Thus, it is apparent that there has been provided, in accordance with the invention, a semiconductor device having a multi-layer metal interconnect structure that fully meets the advantages set forth above. Although the invention has been described and illustrated with reference to specific illustrative embodiments thereof, is not intended that the invention be limited to those illustrative embodiments. Those skilled in the art would recognize that variations and modifications can be made without departing from the spirit of the invention. For example, refractory metal suicide layers can be used in the contact openings to reduce electrical resistance. Furthermore, a variety of metal deposition techniques can be used including metal organic depositions processing, and the like. It is therefore intended to include within the invention all sets of variations and modifications as fall within the scope of the appended claims and equivalents thereof.

What is claimed is:

1. A multi-layer metal interconnect layer in a semiconductor device, the interconnect layer comprising:

a refractory metal nitride layer, the metal refractory nitride layer characterized by a thickness;

a metal interconnect layer overlying the refractory metal nitride layer, the metal interconnect layer having an upper surface; and an antireflective layer overlying and coextensive with the upper surface of the metal interconnect layer, the antireflective layer characterized by a thickness, wherein the thickness of the antireflective layer is no less than the thickness of the refractory metal nitride layer.

2. The multi-layer metal interconnect of claim 1, wherein the antireflective layer thickness is no less than about 1000 angstroms.

3. The multi-layer metal interconnect of claim 1 further comprising a refractory metal layer underlying the refractory metal nitride layer, the refractory metal layer characterized by a thickness, and wherein the thickness of the antireflective layer is no less than the combined thickness of the refractory metal nitride layer and the refractory metal layer.

4. The multi-layer metal interconnect of claim 3, wherein the refractory metal layer thickness is about 100 to about 250 angstroms and the metal nitride layer thickness is about 500 to about 800 angstroms and wherein the antireflective layer thickness is no less than about 1000 angstroms.

5. The multi-layer metal interconnect of claim 1, wherein the refractory nitride metal layer comprises titanium nitride.

6. The multi-layer metal interconnect of claim 1, wherein electrically conductive metal layer comprises an alloy of aluminum and copper.

7. The multi-layer metal interconnect of claim 1, wherein the antireflective coating comprises titanium nitride.

8. A semiconductor device comprising:

a semiconductor substrate having a device layer thereon;

a multi-level metal layer overlying the device layer, wherein the multi-level metal layer includes at least one metal layer having a metal lining layer, a metal interconnect layer overlying the metal lining layer, the metal interconnect layer having an upper surface, and an antireflective layer overlying and coextensive with the upper surface of the metal interconnect layer, each characterized by a thickness, and wherein the thickness of the antireflective layer is no less than the thickness of the metal lining layer.

9. The device of claim 8, wherein the antireflective layer thickness is no less than about 1000 angstroms.

10. The device of claim 8, wherein the metal lining layer comprises a refractory metal layer and a refractory metal nitride layer, each characterized by a thickness, and wherein the thickness of the antireflective layer is no less than the combined thickness of the metal nitride layer and the refractory metal layer.

11. The device of claim 10, wherein the refractory metal layer thickness is about 100 to about 250 angstroms and the metal nitride layer thickness is about 500 to about 800 angstroms and wherein the antireflective layer thickness is no less than about 1000 angstroms.

12. The device of claim 8 further comprising:

an interlevel dielectric layer overlying the at least one metal layer, the interlevel dielectric layer having a via opening therein;

a metal plug filling the via opening; and a metal lining layer overlying the metal plug, wherein the metal plug electrically couples the antireflective layer to metal lining layer.

13. The device of claim 10, wherein the refractory metal layer comprises titanium nitride.

14. The device of claim 8, wherein electrically conductive metal layer comprises an alloy of aluminum and copper.

15. The device of claim 8, wherein the antireflective coating comprises titanium nitride.

16. A multi-layer metal interconnect layer in a semiconductor device, the interconnect layer comprising:

a refractory metal layer;

a refractory metal nitride layer overlying the refractory metal layer;

a metal interconnect layer overlying the refractory metal nitride layer, the metal interconnect layer having an upper surface; and an antireflective layer overlying the upper surface of the metal interconnect layer, the antireflective layer characterized by a thickness, wherein the thickness of the antireflective layer is at least about 1000 angstroms.

17. The multi-layer metal interconnect of claim 16, wherein the refractory metal layer comprises titanium.

18. The multi-layer metal interconnect of claim 17, wherein the refractory metal nitride layer comprises titanium nitride.

19. The multi-layer metal interconnect of claim 18, wherein the metal interconnect layer comprises an alloy of aluminum and copper.

20. The multi-layer metal interconnect of claim 19, wherein the antireflective coating comprises titanium nitride.

* * * * *